United States Patent [19]
Ku et al.

[11] Patent Number: 6,005,767
[45] Date of Patent: Dec. 21, 1999

[54] PORTABLE COMPUTER HAVING ARTICULATED DISPLAY

[75] Inventors: Edmund Ku, Sunnyvale; Richard Huang, Mountain View; Jenny Schlee, La Honda; Joshua Morenstein, San Francisco; Sonja Schiefer, Palo Alto, all of Calif.

[73] Assignee: Vadem, San Jose, Calif.

[21] Appl. No.: 08/970,343

[22] Filed: Nov. 14, 1997

[51] Int. Cl.⁶ ........................................................ G06F 1/16
[52] U.S. Cl. .......................... 361/681; 345/169; 345/905
[58] Field of Search ..................... 361/681, 683; 364/708.1; 312/223.2; 345/169, 905; 70/58

[56] References Cited

U.S. PATENT DOCUMENTS

| | | | |
|---|---|---|---|
| 4,238,792 | 12/1980 | Cohen et al. | 340/707 |
| 4,330,776 | 5/1982 | Dennison, Jr. et al. | 340/365 R |
| 4,438,458 | 3/1984 | Münscher | 358/254 |
| 4,517,660 | 5/1985 | Fushimoto et al. | 364/708 |
| 4,523,087 | 6/1985 | Benton | 235/379 |
| 4,571,456 | 2/1986 | Paulsen et al. | 179/2 C |
| 4,589,659 | 5/1986 | Yokoi et al. | 273/1 GC |
| 4,718,740 | 1/1988 | Cox | 312/208 |
| 4,720,781 | 1/1988 | Crossland et al. | 364/200 |
| 4,742,478 | 5/1988 | Nigro, Jr. et al. | 364/708 |
| 4,749,364 | 6/1988 | Arney et al. | 439/372 |
| 4,785,564 | 11/1988 | Gurtler | 40/448 |
| 4,830,328 | 5/1989 | Takach, Jr. et al. | 248/639 |
| 4,839,837 | 6/1989 | Chang | 364/708 |
| 4,851,812 | 7/1989 | Holmberg | 340/407 |
| 4,859,092 | 8/1989 | Makita | 400/83 |
| 4,861,970 | 8/1989 | Hwang | 235/10 |
| 4,864,523 | 9/1989 | Sasaki | 364/708 |
| 4,903,222 | 2/1990 | Carter et al. | 364/708 |
| 4,949,079 | 8/1990 | Loebner | 340/706 |
| 4,960,256 | 10/1990 | Chihara et al. | 248/284 |
| 4,978,949 | 12/1990 | Herron et al. | 340/711 |
| 5,002,184 | 3/1991 | Lloyd | 206/305 |
| 5,100,098 | 3/1992 | Hawkins | 248/917 |
| 5,103,376 | 4/1992 | Blonder | 361/681 |
| 5,115,374 | 5/1992 | Hongoh | 361/393 |
| 5,168,423 | 12/1992 | Ohgami et al. | 361/394 |
| 5,200,913 | 4/1993 | Hawkins et al. | 364/708 |
| 5,233,502 | 8/1993 | Beatty et al. | 361/729 |
| 5,235,495 | 8/1993 | Blair et al. | 361/680 |
| 5,241,303 | 8/1993 | Register et al. | 340/706 |
| 5,243,549 | 9/1993 | Oshiba | 364/708.1 |
| 5,255,214 | 10/1993 | Ma | 364/708.1 |
| 5,267,123 | 11/1993 | Boothroyd et al. | 361/680 |
| 5,276,589 | 1/1994 | Bartlett et al. | 361/681 |
| 5,335,142 | 8/1994 | Anderson | 361/681 |
| 5,375,076 | 12/1994 | Goodrich et al. | 364/708.1 |

(List continued on next page.)

FOREIGN PATENT DOCUMENTS

| | | | |
|---|---|---|---|
| 0149 762 A1 | 11/1984 | European Pat. Off. | G01F 1/00 |
| 0246 021 A2 | 5/1987 | European Pat. Off. | G06F 1/00 |
| 0251 492 A2 | 5/1987 | European Pat. Off. | G06F 1/00 |
| 0307 892 A2 | 9/1988 | European Pat. Off. | G06F 1/00 |
| 0355 203 A2 | 12/1988 | European Pat. Off. | G06F 1/00 |
| 0749 762 A2 | 12/1996 | European Pat. Off. | 39/26 |
| 61-131356 | 8/1986 | Japan | G06F 1/00 |
| 1-131913 | 5/1989 | Japan | G06F 1/00 |
| 3-41326 | 4/1991 | Japan | G06F 1/16 |

Primary Examiner—Donald Sparks
Assistant Examiner—John D. Reed
Attorney, Agent, or Firm—Flehr Hohbach Test Albritton & Herbert LLP

[57] ABSTRACT

A portable computer. The computer includes a base, a display member, and an arm assembly coupling the display member to the base. The arm assembly includes a pair of spaced arm portions and a rigid connecting portion extending between the arm portions. The arm portions each have a first end pivotally coupled to the base edge for movement of the arm assembly between a closed position with the arm portion substantially parallel to the base and an open position with the arm portion oriented at an angle relative to the base, and a second end pivotally coupled to the display edge for pivotal movement of the display member relative to the arm portion to move the display member between a plurality of positions relative to the arm member.

27 Claims, 7 Drawing Sheets

U.S. PATENT DOCUMENTS

| | | | |
|---|---|---|---|
| 5,410,447 | 4/1995 | Miyagawa et al. | 361/681 |
| 5,481,430 | 1/1996 | Miyagawa et al. | 361/681 |
| 5,498,165 | 3/1996 | Tseng | 364/708.1 |
| 5,503,361 | 4/1996 | Kan-O et al. | 248/688 |
| 5,559,670 | 9/1996 | Flint et al. | 361/681 |
| 5,583,744 | 12/1996 | Oguchi et al. | 361/683 |
| 5,594,619 | 1/1997 | Miyagawa et al. | 361/681 |
| 5,668,570 | 9/1997 | Ditzik | 361/681 |
| 5,668,695 | 9/1997 | Nakamura et al. | 361/683 |
| 5,781,407 | 7/1998 | Brauel | 361/683 |

PORTABLE COMPUTER HAVING ARTICULATED DISPLAY

TECHNICAL FIELD

The present invention relates in general to a portable computer and, more particularly to a computer having a display screen which may be used to input information.

BACKGROUND OF THE INVENTION

Portable computing devices, including computers, laptop computers, notebook and subnotebook computers, and personal data organizers (PDA's) are typically unitary devices having a clam-shell configuration, with a base including the keyboard, optional hard drive and floppy disk drive unit, and other electrical components including a central processing unit CPU and memory, and a display component pivotally coupled to the base by a hinge. The display is movable about the hinge between a closed position, with the display screen positioned adjacent the keyboard, and an open position, with the display screen inclined at a viewing angle. With its reduced size and weight, this type of device is conveniently portable, allowing an individual to carry the computer and use the computer at different locations.

The reduced size, while improving the portability of the device, often creates discomfort when the computer is used for extended periods of time. For example, the user may have difficulty in orienting the display at a convenient viewing angle. With its clamshell configuration, the screen is positioned just above the keyboard, requiring the user to open the screen to an angle of at least 140° to conveniently view the screen without straining the neck, shoulders and upper back. However, in some situations factors such as the available space, lighting and the like may prevent the user from sufficiently opening the computer to conveniently view the display screen. It may also be difficult to place the display screen at the preferred viewing distance and still eliminate distracting reflections from environmental light sources. A portable computer in which the angle and height of the display may be adjusted relative to the base is desirable.

With some portable computers, the display is provided by a touch sensitive screen which may be used to input information by touching specific areas of the screen with an instrument or finger. An example of such computers is a notebook computer where data is entered solely through the touch sensitive screen, eliminating the need for a keyboard. Other types of computers include both a keyboard and a touch sensitive screen, providing the user with the option of entering data through the screen or keyboard.

U.S. Pat. No. 5,268,817 discloses an example of a portable computer which includes a keyboard and a touch sensitive screen. The display screen is mounted in an outer frame, which is in turn hingedly attached to the base in a clamshell configuration. The display screen is pivotal within the outer frame to orient the screen in a first position, with the screen facing in the general direction of the keyboard, and a second position flipped 180° relative to the first position. With the screen in the first position, the display may be moved between open and closed positions by pivoting the outer frame relative to the base in the same manner as standard portable computers. When the display screen is flipped 180° and the outer frame pivoted to the closed position covering the keyboard, the display screen is exposed such that the computer functions as a standard notebook computer. The disclosed computer combines the advantages of a notebook computer, where the individual enters information in the same matter as writing the information on a notepad, with the advantages of standard portable computer. However, the disadvantages created by the reduced size of the computer are present in the disclosed computer. A computer in which the screen may be conveniently adjusted to a variety of positions, including one in which the display covers the keyboard with the screen exposed, is desirable.

OBJECTS AND SUMMARY OF THE INVENTION

It is a primary object of this invention to provide a portable computer having an articulated display.

It is another object of this invention to provide a portable computer in which the display may be retained in a selected one of a plurality of different positions.

It is yet another object of this invention to provide a portable computer in which the display may be lowered onto the keyboard in a position leaving the screen exposed.

It is still another object of this invention to provide a portable computer in which the height and angle of the display relative to the base may be adjusted to a convenient viewing position.

A more general object of this invention is to provide a portable computer which is lightweight and convenient to transport, and which may be economically manufactured and maintained.

In summary, this invention provides a lightweight portable computer which is particularly convenient to use. The computer includes a base having an upper surface with a keyboard, a bottom surface and a peripheral edge joining the upper and bottom surfaces and a display having a front surface including a screen for displaying information, a back surface, and a peripheral edge joining the front and back surfaces. The display is coupled to the base by an arm assembly including a pair of spaced arm portions and a rigid connecting portion extending between the arm portions. The arm portions each have a first end pivotally coupled to the base edge for movement of the arm assembly between a closed position, with the arm portion substantially parallel to the base, and an open position, with the arm portion oriented at an angle relative to the base. The arm portions each have a second end pivotally coupled to the display edge for pivotal movement of the display member relative to the arm portion to move the display member between a plurality of positions relative to the arm member.

Additional objects and features of the invention will be more readily apparent from the following detailed description and appended claims when taken in conjunction with the drawings.

DETAILED DESCRIPTION OF THE INVENTION

Figure 1:
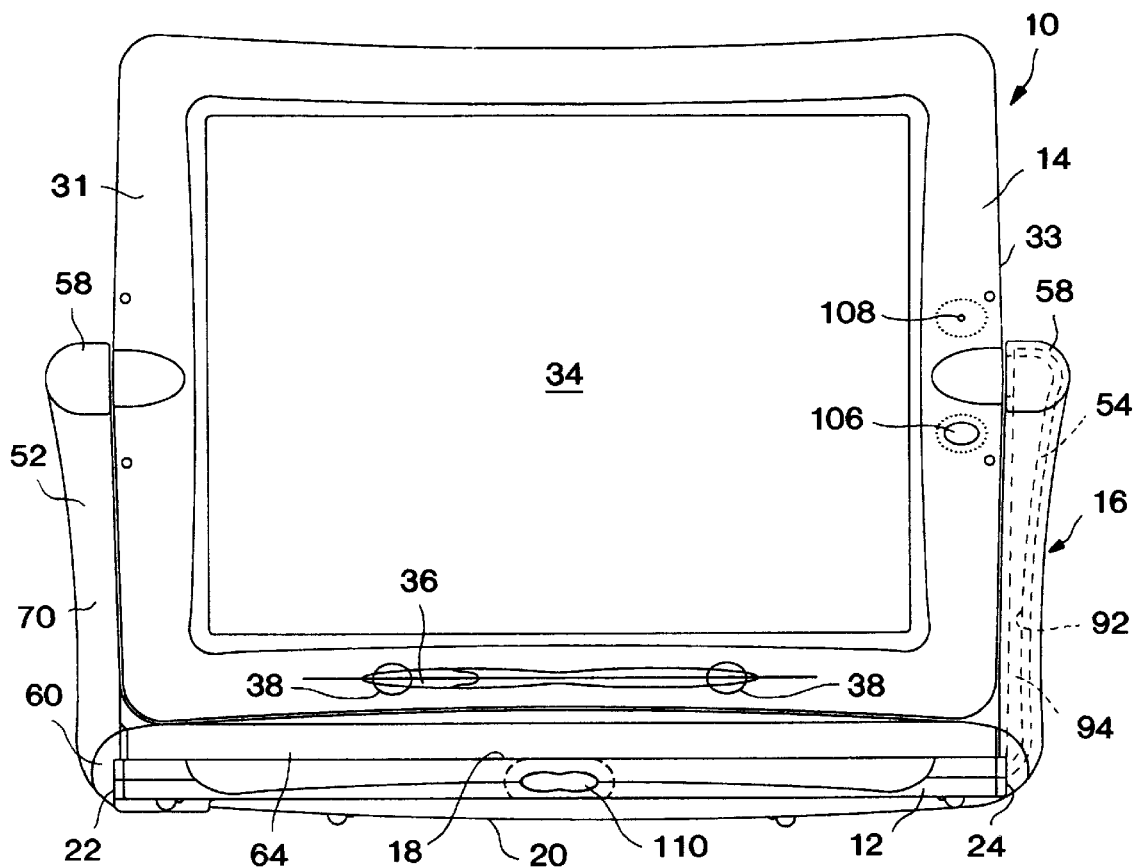
FIG. 1 is a front plan view of a portable computer constructed in accordance with the present invention, shown with the display in an open position.
Figure 9:
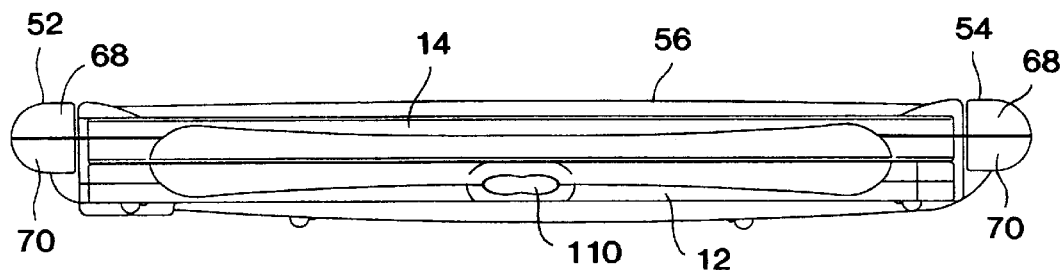
FIG. 9 is a front end view of the computer of FIG. 1, shown with the display overlying the base.

Reference will now be made in detail to the present embodiments of the invention, which are illustrated in the accompanying figures. Turning now to the drawings, wherein like components are designated by like reference numbers throughout the various figures, attention is directed to FIGS. 1–3.

Portable computer 10, constructed in accordance with this invention, is particularly convenient to store, transport and use. The computer 10 generally includes a base 12, a display member 14, and an arm assembly coupling the display 14 to the base 12. The base 12 houses the internal working components of the computer, including the Central Processing Unit (CPU), optional hard drive, memory chips, including ROM and RAM, optional floppy disk drive unit, optional PC card slot(s) internal modem, infrared (IrDA) port, battery, electrical connectors and the like. Advantageously, the computer may be a single chip or "computer on a chip" type implementation to reduce size and weight of internal components, and power conservation procedures are implemented such that battery life of up to 20 hours is realized. The internal working components of the computer 10 are well known and therefore are not described in further detail. One embodiment of the inventive portable computing device is configured for minimum size and weight eliminates the hard disc drive and floppy disc drive units and provides operating system (for example DOS, Windows 95, or Windows CE) and predetermined software applications (for example, word processing, phone list, organizer, e-mail, graphics, and the like) in ROM. Although not shown in detail, the base 12 is provided with a number of exterior ports as is known in the art to facilitate connection of the computer 10 to a printer, docking station of a desk top computer, peripheral devices, telephone line and the like.

Figure 8:
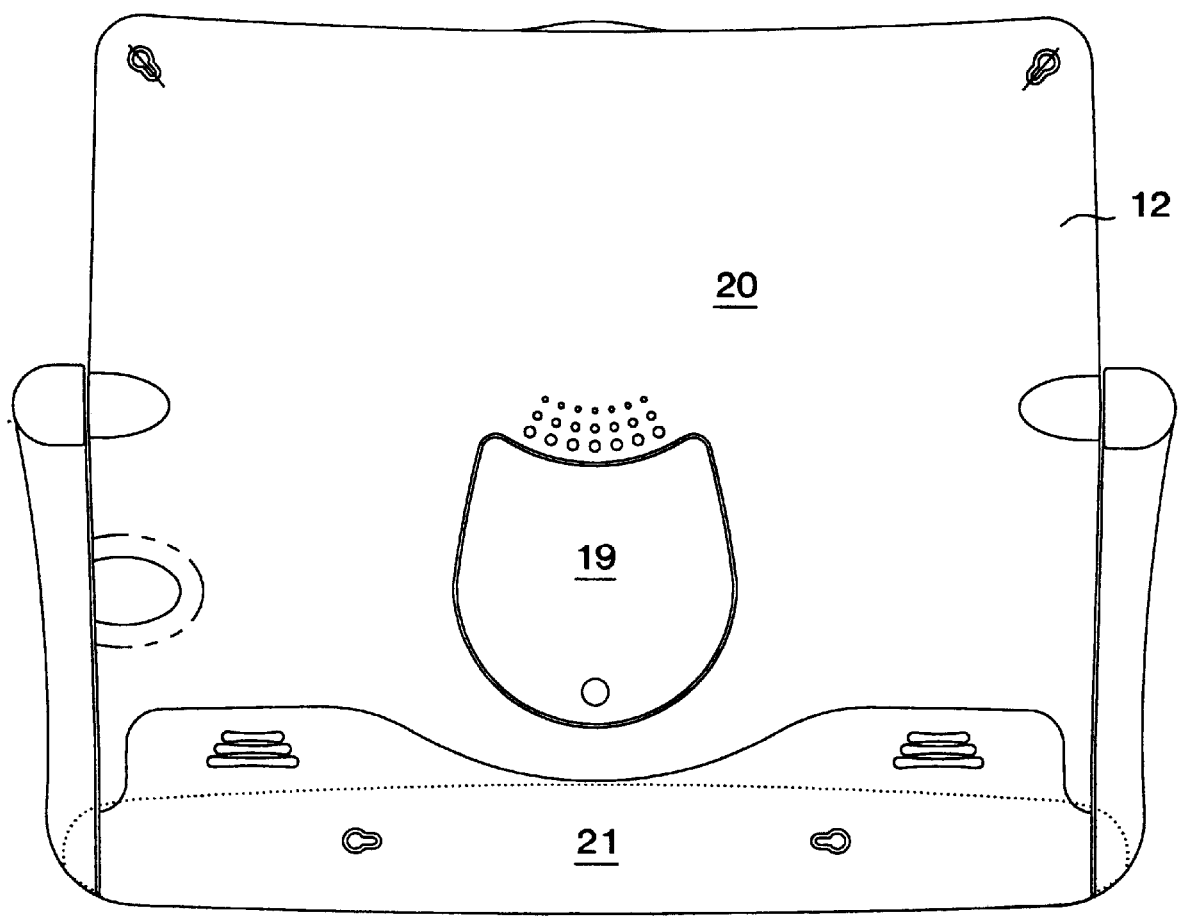
FIG. 8 is a bottom plan view of the computer of FIG. 1.

In the illustrated embodiment of the invention, the base 12 has a generally rectangular configuration including an upper surface 18 and a bottom surface 20 which is positionable on a support surface. The base is provided with removable doors 19 and 21 which provide access to the interior of the base for insertion of RAM chips (so that memory may be increased at user discretion) and removal and replacement of the battery (FIG. 8). The base includes side edges 22 and 24 which may be provided with the opening of the optional disk drive unit(s) as well as one or more of the external ports. A keyboard 26 is positioned at the front end portion 28 of the base 12. In the preferred embodiment of the invention, the keyboard 26 is curved about an axis generally designated 28 intersecting the middle of the keyboard. With this configuration, the keyboard 26 ergonomically positions the hands of the user with the elbows extending outwardly from the body. A standard, rectangular keyboard may be used instead of keyboard 26, although the shape of the standard keyboard has a tendency to cause the user to distort his wrists inwardly, particularly when the overall size of the base and keyboard are reduced. A port may also be optionally provided to attach external keyboard and/or pointing device to the computer.

The display 14 generally includes a front surface 31 including a display screen 34, a back surface 32 and a peripheral edge 33. In the present embodiment of the invention, the screen 34 is a touch sensitive screen which both displays data and which may be used to input data into the computer. However, it is to be understood that in other embodiments of the invention the computer may include a screen which is only capable of displaying information. In such configurations, input to the computer may be by keyboard input and or other pointing device such as mouse, trackball, joy stick, or other touch sensitive pointing device. Voice navigation and/or input may also be provided and such systems, such as systems by IBM, Dragon System, for example, may be used. The screen 34 used in computer 10 of this embodiment is a backlit color Liquid Crystal Display (LCD) manufactured by Sharp to have a reduced thickness and weight. Touch sensitive screens are also available from other manufacturers, including Toshiba. As is known in the art, data may be entered through the screen 34 using an implement such as a touch stylus 36 or the user's finger including data, graphics, icons, pointer and other images which appear on the screen provide a Graphical User interface (GUI) and are controlled by software, with the displayed images typically including designated areas which may be contacted to input, edit, or otherwise access information. When the user touches one of the designated areas of the screen image, the touch sensitive screen 34 transmits a signal to the working components of the computer as is known in the art. In the illustrated embodiment, the front surface 31 of the display includes at least one clip retainer 38 for holding the stylus 36 when it is not in use, retaining the stylus in convenient reach of the user. The upper surface 18 of the base 12 is formed with a recess 40 shaped to receive the stylus 36 and clip retainer 38 when the computer is closed by moving the front surface 31 of the display 14 onto the base 12. However, it is to be understood that other means may be employed to retain the stylus, and the stylus may be releasably attached to the base or arm assembly of the computer instead of the display or eliminated entirely so that an external stylus or the user's finger alone is used for pointing.

When the display 14 is closed onto the base 12 with the screen 34 facing the upper surface 18, the back surface 32 of the display 14 and the bottom surface 20 of the base 12 provide a protective outer cover. If additional protection is desired, the closed computer 10 may be slipped into a protective case (not shown).

Figure 2:
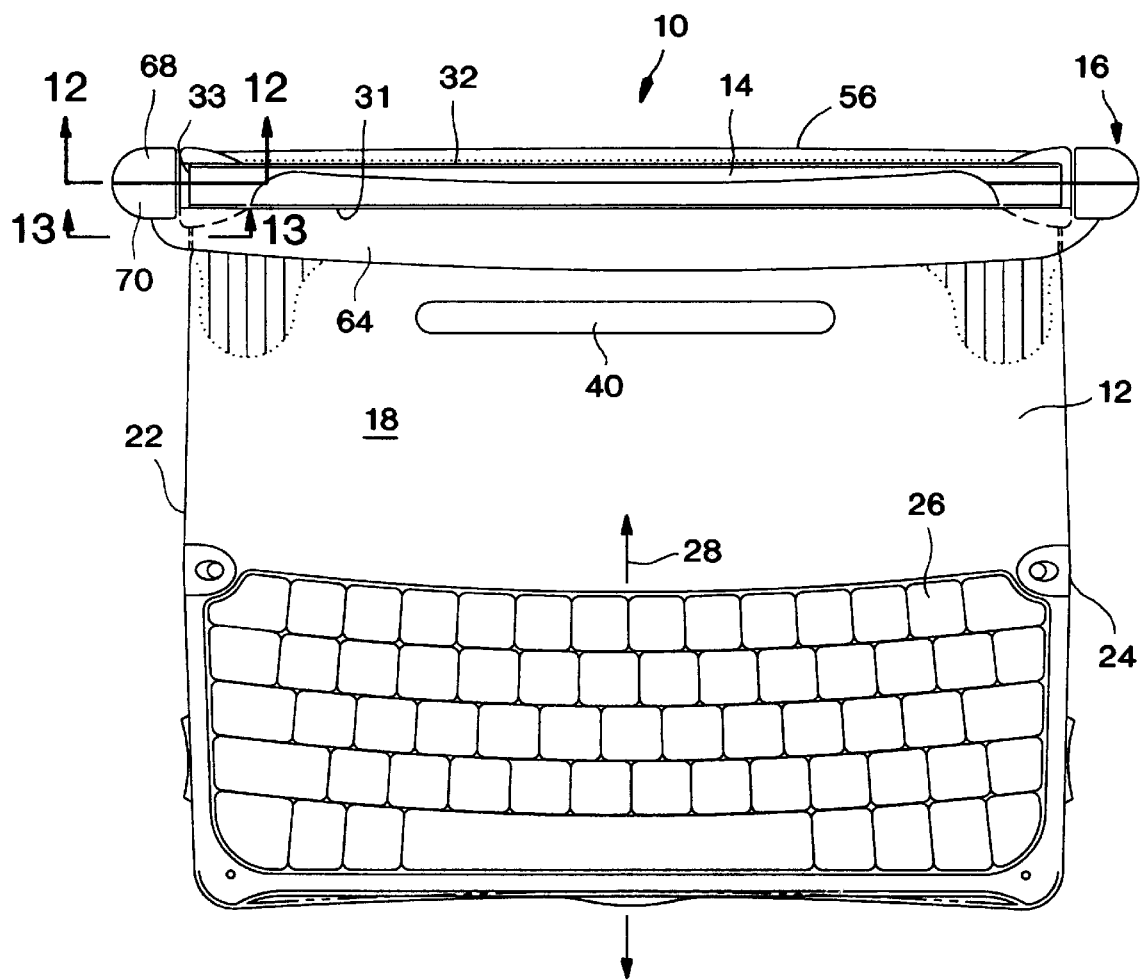
FIG. 2 is a top plan view of the computer of FIG. 1.
Figure 3:
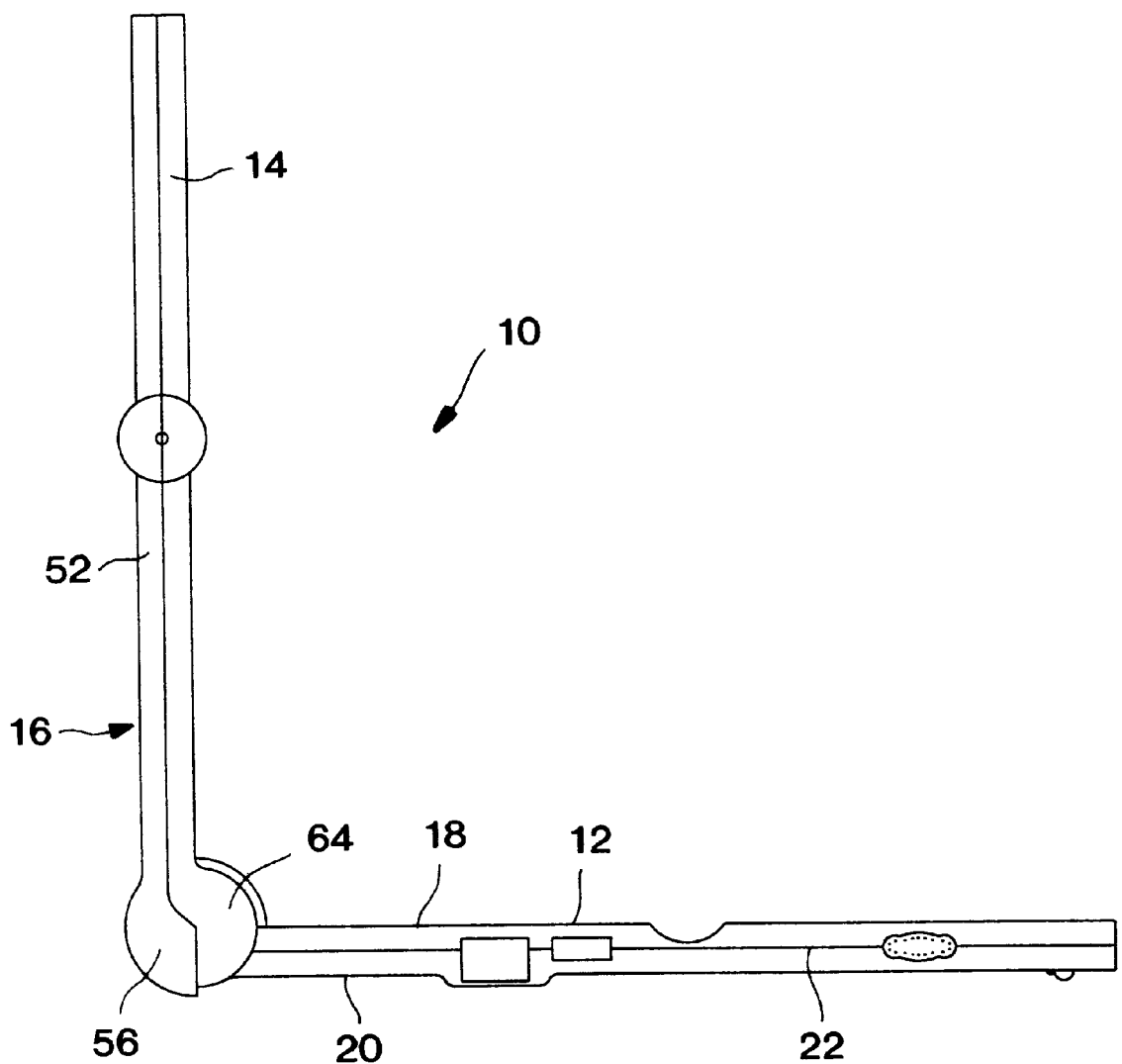
FIG. 3 is a side view of the computer of FIG. 1.
Figure 10:
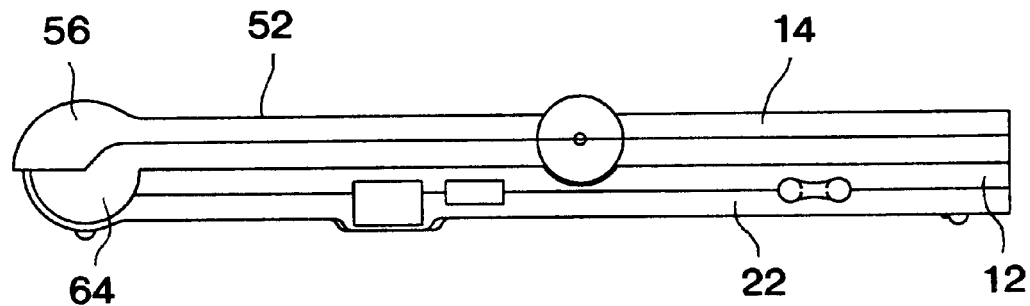
FIGS. 10 and 11 are side views of the portable computer of FIG. 1, shown with the display overlying the base.
Figure 4:
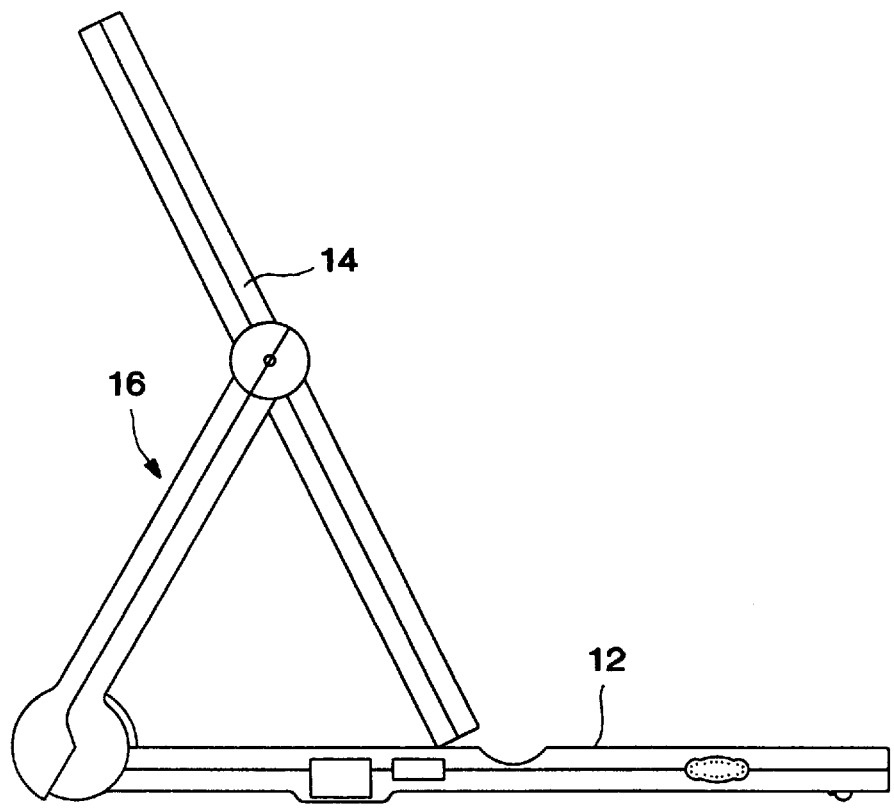
FIGS. 4 and 5 are a side views similar to FIG. 3, shown with the display in other positions.
Figure 5:
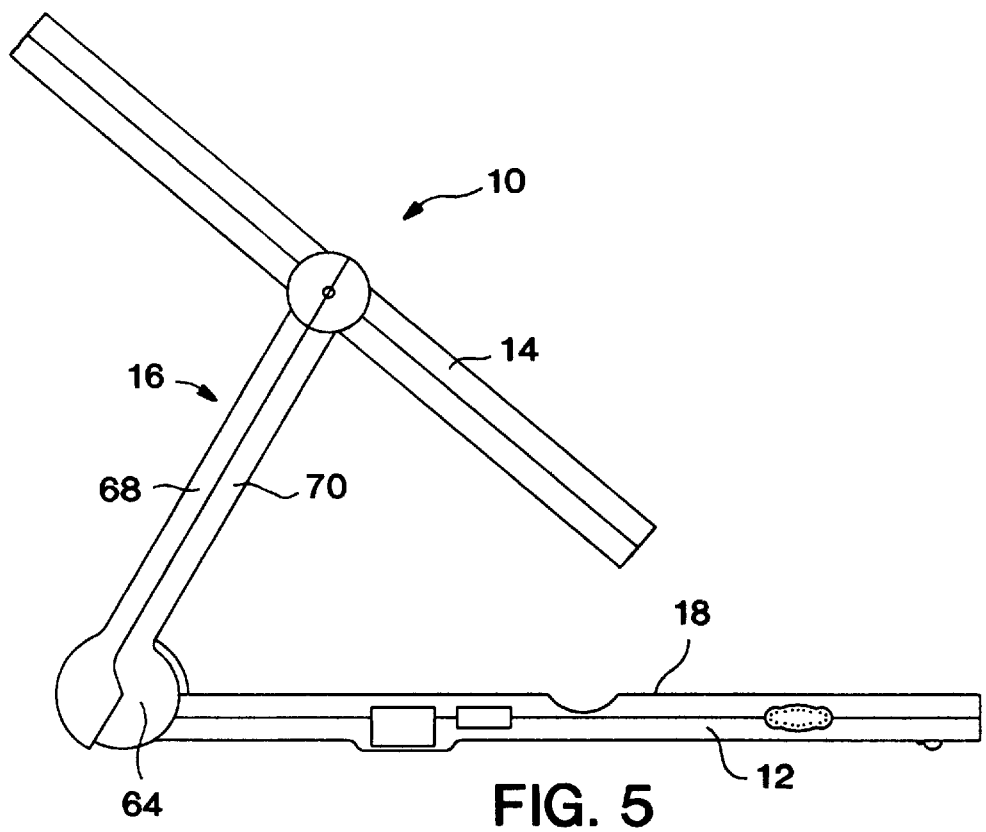
Figure 6:
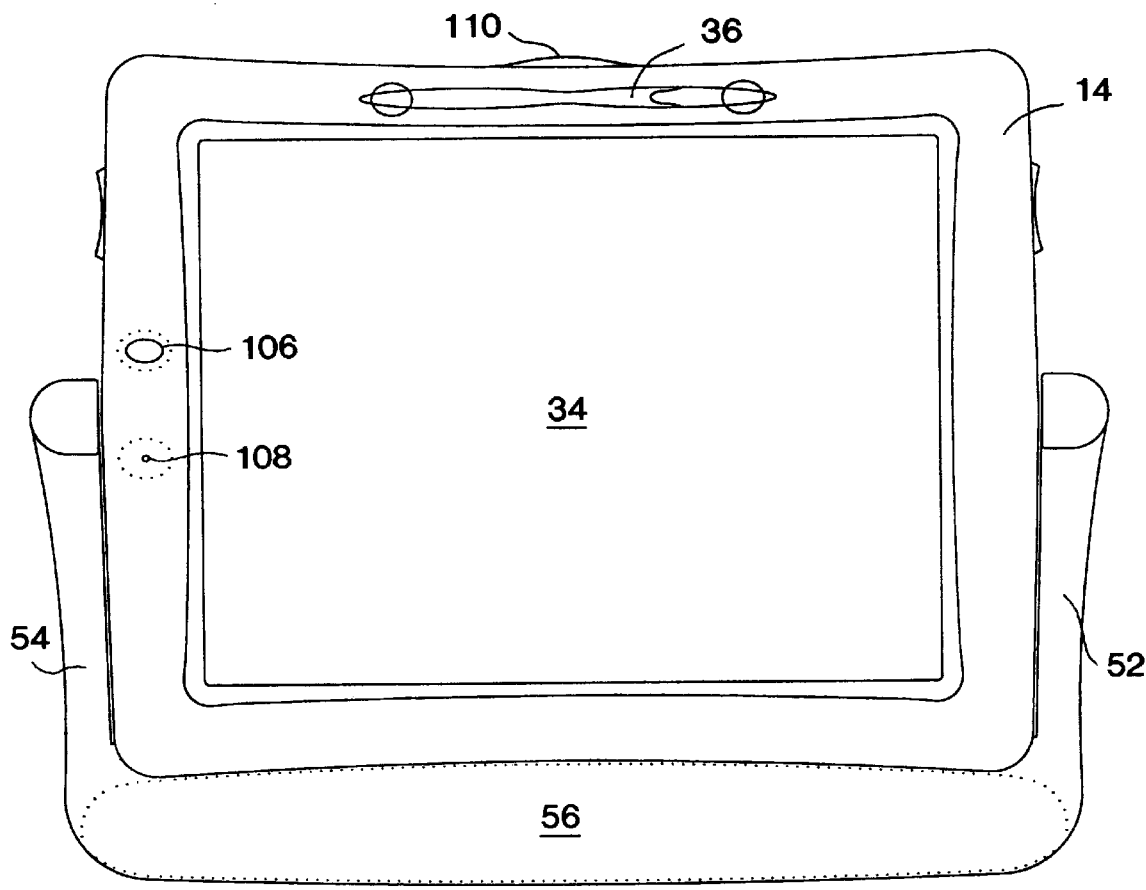
FIG. 6 is a top plan view of the computer of FIG. 1, shown with the display overlying the base in one position.
Figure 11:
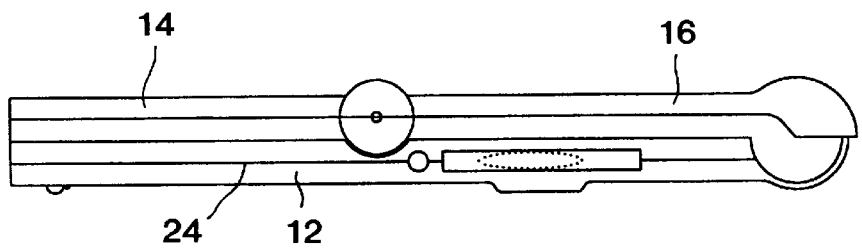

The arm assembly or frame body 16 couples the display member 14 to the base 12 such that the display member 14 may be moved to a plurality of different positions. FIGS. 1–3, 4, and 5 show examples of open positions in which the display 14 is tilted at a viewing angle and the keyboard 26 is exposed for use. Both the height and angle of the display 14 relative to the base 12 may be adjusted. FIG. 5 shows an example of a position where the display 14 is suspended above the upper surface 18 of the base, allowing the display 14 to be oriented at an angle greater than 90° without significantly increasing overall footprint of the computer 10. FIG. 4 shows an example of another open position in which the lower edge of the display 14 rests on the upper surface 18 of the base. In this position, the display 14 does not increase the footprint of the computer 10. The ability to move the display to the positions shown in FIGS. 4 and 5 are of particular advantage in when operated in cramped conditions, such as while traveling on an airplane, or during a meeting or other circumstance where the computer 10 must be as unobtrusive as possible. In the illustrated embodiment, which includes a touch sensitive screen 34, the computer 10 may also be adjusted so that the screen 34 is exposed when the display 14 is lowered onto the upper surface 18 of the base 12 as shown in FIG. 6. In this position, the computer 10 functions as a notepad computer and data is entered entirely through the touch sensitive screen. In one embodiment, the touch sensitive screen is configured to display a virtual keyboard such that areas of the screen display keys (such as the QWERTY pattern), and when touched transmit the letter, number, or other character to the CPU as if an actual keyboard were provided. This allows the touch sensitive screen to be used for graphical (stylus) inputs as well as keyboard inputs without changing the configuration of the computer. The available positions are not to be limited to those shown in the Figures.

The U-shaped arm assembly or frame body 16 generally includes a pair of spaced lateral arm portions 52, 54 and a base or connecting portion 56 extending between the arm portions 52. The upper ends 58 of the arm portions 52, 54 are pivotally coupled to the peripheral edge 33 of the display. In the preferred modification of the invention, the arms 52, 54 are coupled to the sides of the display at the approximate midpoint between the upper and lower edges of the display. With this configuration, the weight of the display 14 is balanced relative to the arm assembly 16 such that the display 14 may be easily supported at the selected angle relative to the arm assembly. However, it is to be understood that the position where the arm assembly 16 attaches to the display member 14 may be adjusted within the scope of this invention. In this embodiment, the display 14 may be moved from a zero position shown for example in FIG. 1, where the display is substantially parallel to the arm portions with the screen 34 facing forward, to a position flipped 180° from the zero position, with the display 14 parallel to the arm portions 52, 54 and the screen 34 facing rearwardly. Preferably, rotation greater than 180° from the zero position is prohibited to reduce stresses on the electrical connectors between the display member 14 and the base 12.

The lower ends 60 of the arm portions 52, 54 are pivotally coupled to the side edges 22, 24 of the base at the rear end portion of the base 12. The base or connecting portion 56 extends along the rear end of the base. The rigid connecting portion 56 reinforces the arm assembly 16, providing stability and reducing torsional stresses during movement of the arm assembly 16. The arm assembly 16 rotates between a zero position, with the arm portions 52, 54 substantially parallel to the base, and a fully open position with the arms inclined at an angle relative to the base. In the illustrated embodiment, the arm portions are oriented at an angle of 90° relative to the base when the arm assembly 16 is in the fully open position. This configuration ensures the center of gravity of the display is always located directly above the base 12, increasing the stability of the open computer 10 by preventing the computer from falling backward. Retaining the center of gravity of the display over the base 12 is of particular advantage in the preferred embodiment of the invention, where the total weight of the computer has been minimized. Specifically, the weight of the display is about 1 lb to 1.2 lbs and the weight of the computer withhold optional disc drives is only about 2.6 to 3.0 lbs, depending on configuration and is less than about one (1) inch thick. However, it is to be understood that rotating the arm assembly more than 90° is within the scope of this invention, particularly in other embodiments of the invention where the base weighs considerably more than the display.

In the illustrated embodiment of the invention, the rear end portion of the base is formed with an enlarged rounded portion, generally designated 64. The connecting portion 56 has a generally concave cross sectional shape as shown by the interrupted lines in FIG. 1 which conforms to the shape of the rounded portion 64 of the base. As the arm assembly is rotated relative to the base, the connecting portion slides or rotates around the rounded portion of the base 12. In addition to facilitating manipulation of the arm assembly 16 between the zero position and the fully open position, the concave shape increases the rigidity of the connecting portion 56.

Figure 7:
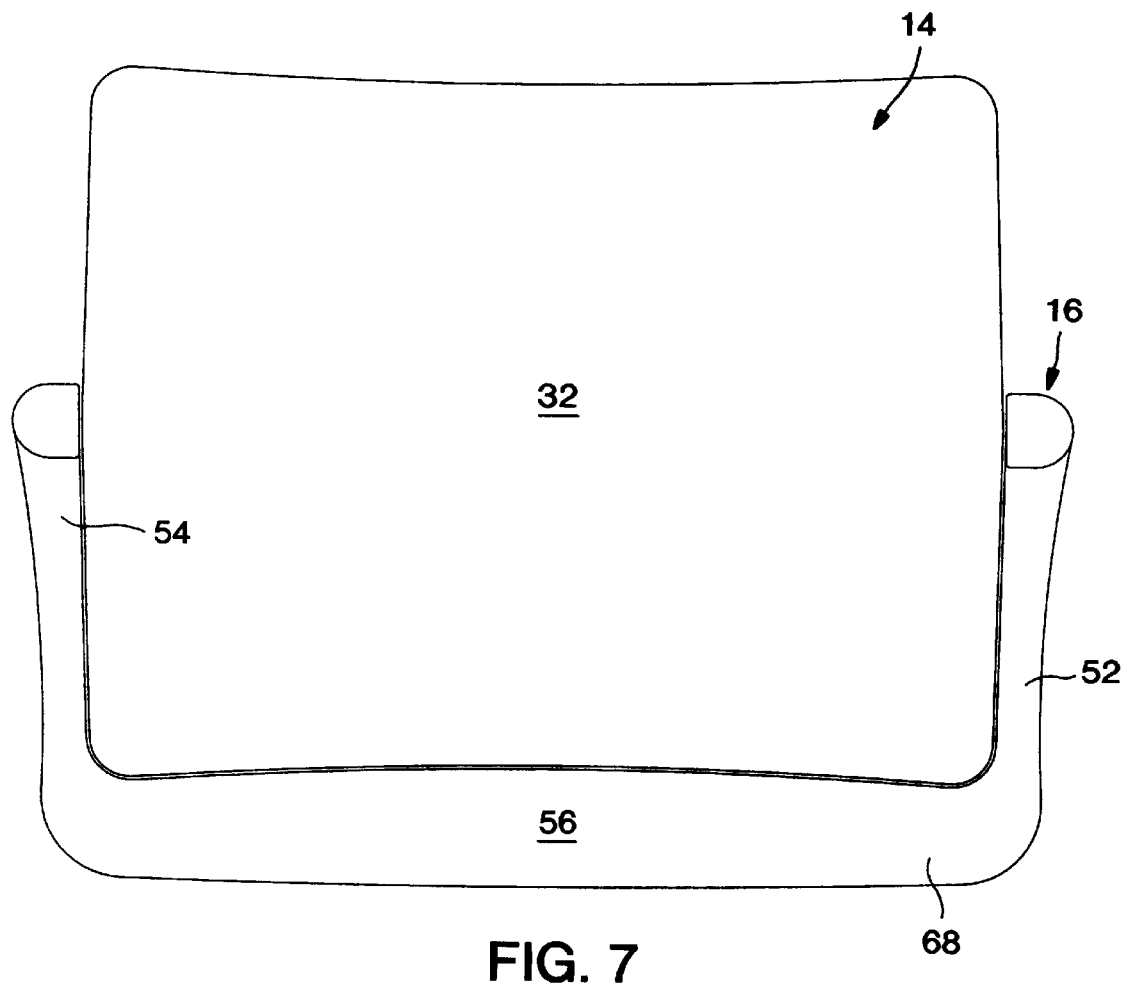
FIG. 7 is a view similar to FIG. 6, shown with the display overlying the base in a second position.

The arm assembly 16 of the illustrated embodiment includes a U-shaped rigid back member 68 including the back section of the arm portions 52 and 54 and the connecting portion 56 (FIG. 7). The arm portions 52 and 54 are completed by front members 70 which are secured to the back member 68 by screws or other suitable fasteners. The unitary back member 68 is preferably formed of a light weight metal such as aluminum for optimum strength. The front members 70 are formed of a plastic material reinforced by fiberglass or carbon fiber to reduce the overall weight of the arm assembly but still retain strength. However, the front members 70 may be formed of other materials including metals if desired. Moreover, the back member 68 may be formed of materials other than metal provided the material has sufficient strength to support the display member 14.

Figure 12:
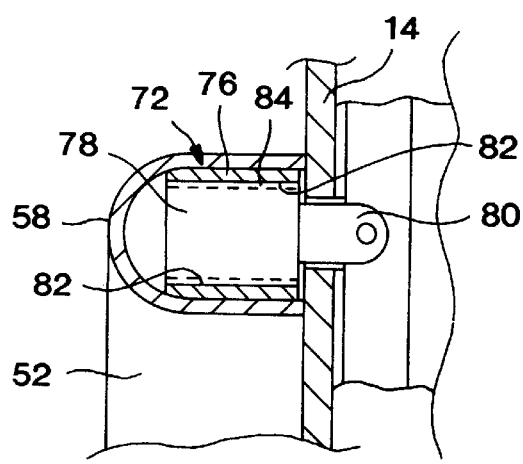
FIG. 12 is an enlarged sectional view taken substantially along lines 12—12 of FIG. 2.

Arm portion 52 of the frame body 16 is pivotally coupled to the display member 14 and base 12 by friction hinges 72 and 74. As shown in FIG. 12, the hinge 72 generally includes an outer sleeve 76 and an cylinder 78. The sleeve 76 is fixedly mounted to the arm portion 52, with a tab 80 projecting from the cylinder 78 extending into the display member 14. The tab 80 is mounted to the interior skeletal frame of the display member. The cylinder 78 is rotatable within the sleeve 76 upon application of sufficient force to the cylinder, through the display member 14 and tab 80, to overcome the frictional forces between the exterior of the cylinder 78 and the interior of the sleeve 76. Once the user has released the display 14, the frictional forces between the sleeve and the cylinder retain the display in the desired position.

In the present embodiment of the invention, the hinge 72 includes two locking positions, one corresponding to the zero position of the display member 14 and the other corresponding to the position flipped 180° from the zero position. When the display member 14 is in either of these positions, a greater force must be applied to the display member 14 to move the display member from the position. In this embodiment of the invention the inner surface of the sleeve 76 is formed with two grooves 82 while the exterior of the cylinder 78 has a projection or detent 84 thereon. The detent 84 seats in the grooves 82 when the display member is moved to the zero position and the 180° position, respectively. Between the two locking positions, the display member 14 is held in place by friction.

Figure 13:
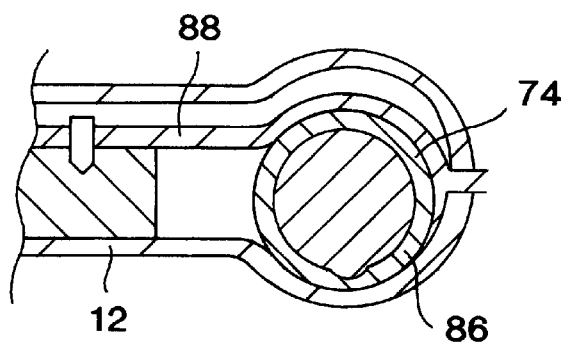
FIG. 13 is an enlarged sectional view taken substantially along lines 13—13 of FIG. 2.

Hinge 74 is similar to hinge 72 as shown in FIG. 13. The outer sleeve 86 of the hinge 74 is mounted to the base 12, while the tab projecting from the cylinder is mounted to the arm portion 52. In the present embodiment, the sleeve 86 is mounted to the base 12 by a metal band 88 which is mounted at one end to the base 12. The band 88 extends around the sleeve 86 and the other end of the band engages the rear edge of the base 12, with the band applying a compressive force to secure the sleeve 86 in a fixed position. Similar to hinge 72, hinge 74 includes two locking positions, one corresponding to the zero position with the arm portions 52, 54 substantially parallel to the base and the fully open position with the arm portions 52, 54 oriented at 90° relative to the base. As discussed above, the locking positions are defined by grooves formed in the interior surface of the sleeve 86 and a detent formed on the exterior of the cylinder of the hinge 74. The engagement between the detent and groove of the hinge 74 is sufficient to securely retain the display member 14 in the closed position with the arm members substantially parallel to the base. As the arm assembly 16 approaches the zero or closed position, with the detent approaching the edge of the groove, the detent has a tendency to move into the groove such that the display member 14 is snapped toward the base 12, facilitating closure of the computer 10. Thus, in the illustrated embodiment of this invention a separate locking mechanism is not provided. However, it is to be understood that a mechanism securing the display member 14 in the closed position may be employed if desired.

In the preferred form of the invention, one of the arm portions is provided with both hinges 72, 74. In the illustrated embodiment, the left arm portion 52 is provided with the hinges. However, it is to be understood that the hinges may be moved to the right arm portion 54 if desired. With the hinges located in arm portion 52, the other arm 54 is provided with an internal conduit 92 which houses the electrical connectors 94 coupling the screen 34 to the components housed in the base 12 as shown in FIG. 2. In the illustrated embodiment, the electrical connectors 94 are carried by a ribbon as is known in the art. The ribbon 94 is threaded through a path which minimizes the stresses exerted on the ribbon during rotation of the arm assembly 16 relative to the base 12, and rotation of the display member 14 relative to the arm member. As the ribbon 74 enters the arm portion 54 from the display member 14, a complete loop (not shown) is formed in the ribbon. The loop selectively becomes tighter and looser as the display 14 is pivoted relative to the arm portion 54, preventing the electrical connectors 94 from crimping. Similarly, instead of feeding the ribbon in a direct path from the arm portion 54 to the base 12, a second loop (not shown) is provided before the ribbon enters the base 12. This loop also reduces stresses on the ribbon during manipulation of the arm assembly 16.

The computer 10 includes a battery (not shown) for supplying power for the computer 10. As is known in the art, the computer 10 preferably also includes AC adaptor port for supplying power without using the battery. The battery is preferably a lithium ion rechargeable battery, although the use of other types of batteries is within the scope of this invention. The battery is positioned in the rounded portion 64 of the base 12 such that the pivot axis extends through the battery. With this configuration, the overall size of the computer may be reduced. The battery is removable through the door 21. The battery is held within the battery compartment of the base by prongs (not shown) extending from the opposite ends of the battery. When in position, electrical contact is made between contacts on the battery and connectors which are coupled to the printed circuit board within the base 12 (not shown). Power conservation features to maximize battery life are advantageously implemented such as those disclosed in U.S. Pat. No. 5,396,635 and co-pending patent application Ser. Nos. 08/767,821; 08/459,341; 08/460,078; and 08/458,189; which are incorporated by reference herein.

The computer 10 of the illustrated embodiment is automatically turned on for operation when the display 14 is lifted from the closed position overlying the base 12. This effect is achieved by a number of sensors which cooperate to identify the position of the display relative to the base. A first sensor 102 is provided on the upper surface of the base 12 to signal when the display member is in a position overlying the base. The display may be in one of two orientations when overlying the base. The base includes a second sensor 104 to determine when the display is in the closed position, with the screen 34 facing the base 12. In the illustrated embodiment, the sensor is positioned in the recess 40 where it detects the presence of the clip retainer, indicating that the display is in the closed position and the screen is facing downwardly. When these conditions occur, the computer 10 is turned off. When the sensors 102 and 104 detect that the display has been moved from the closed position, the computer is automatically activated to the "on" condition. In this context, ON may mean that power is ON and that the CPU is operating in an active state, while OFF may mean that the computer is in some reduced power state such as in hybernation mode, sleep mode or the like power conservation mode. OFF may also mean that the computer is completely turned off. An advantage of eliminating disc drive in some embodiments is the virtually instant start up associated with loading operating system and applications from ROM. The memory door 19 and the battery door 21 also include sensors (not shown) which senses whether or not these doors are open so that a predetermined operating mode may be invoked or retained depending on the sensor condition. For example, if the memory door or battery door are open, the computer will remain OFF or in some hibernation or sleep mode. Sensors may also be provided to inform the computer of the orientation of the display so that the display screen and operating condition may be controlled accordingly. Sensors may be contact type or contact less, including such known devices as microswitches, magnetic switches, LED/photodiode sensor pairs, and the like. Logic circuits query the conditions of the switches and provide inputs to the CPU or other logic means to control or modify operation.

To allow the user to manually turn off the computer 10, the computer includes an on-off switch 106 located on the front surface 31 of the display 14. An indicator light 108 provides a visible signal indicating the on/off (operating/non-operating) condition of the computer 10. An alarm light 110 is also provided to alert the user to various conditions. For example, the computer 10 may include scheduling software with the indicator alerting the user of a scheduled appointment or meeting. Although not included in the illustrated embodiment, the computer 10 may include a pager, with the alarm light being activated to notify the user of an incoming message. If a wireless modem is provided, the alarm light may also be used to notify the user of an incoming electronic message.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A portable computer comprising:
   a base having an upper surface, a bottom surface, and spaced first and second side edges, a rear end portion, and a front end portion having a front peripheral base edge;

a display member having a front surface having a display screen for displaying information, a back surface, and first and second peripheral display edges joining said front and back surfaces;

a U-shaped frame body mounting said display member to said base, said frame body including:

first and second spaced lateral arm portions positioned outwardly of said side edges of said base and said peripheral display edges when said display member is lowered onto said base; and a rigid connecting portion extending along said rear end portion of said base between said arm portions having a curved tubular cross section that reinforces the U-shaped frame body to provide stability, rigidity, and reduce torsional stresses during movement of the frame body and forms a concave pocket to receive a substantially conforming convex portion of said base at the rear end portion of said base;

said frame body being pivotally coupled to said first display edge for rotation of said display member relative to said first arm portion, and pivotally coupled to said first side edge of said base at said rear end portion of said base for rotation of said frame body relative to said base, said rigid curved tubular connecting portion of said frame body sliding concentric with and relative to said convex portion of said base during rotation of said frame body relative to said base;

said first arm portion being provided first and second friction hinges and said second arm portion being provided with no hinges, said first spaced lateral arm portion being pivotally coupled to said first peripheral edge of said display member by a first friction hinge and to said base by a second friction hinge; and said second arm portion being provided with an aperture forming an internal conduit from said base to said second arm portion which houses an electrical connector for coupling said screen housed in said display member to electrical components housed in said base.

2. The portable computer of claim 1, further comprising a keyboard, and wherein said first and second friction hinges are configured for rotation of said frame body between;

(i) a first closed configuration in which said display screen is configured substantially parallel to said base upper surface and facing toward said base upper surface in a closed position to cover said keyboard and said arm portions of said frame body are positioned adjacent said side edges of said base;

(ii) a second configuration in which said display screen is configured substantially parallel to said base upper surface for inputting data to said portable computer and covers said keyboard and said arm portions of said frame body are positioned adjacent said side edges of said base;

(iii) a third configuration in which said keyboard accessible for inputting data to said portable computer and said display screen is configured for viewing by a user while accessing said keyboard; and (iv) a fourth position in which said display screen is configured at an acute angle relative to said base upper surface for presentation to others and a first portion of said peripheral base edge and a portion of said peripheral display edge are disposed to support said portable computer on a surface with an outwardly directed display screen for presentation.

3. The portable computer of claim 2 in which said hinges include a first locking position in which said frame body is releasably secured in a closed position with said arm portions of said frame body positioned adjacent said side edges of said base.

4. The portable computer of claim 3 in which said hinge device includes a second locking position in which said frame body is releasably secured in an open position with said arm portions oriented at an angle relative to said base.

5. The portable computer in claim 2, wherein said computer is automatically turned on for operation when the display is lifted from the closed position, said automatic turn on being achieved by a plurality of cooperating sensors including a first sensor to identify the position of the display relative to the base, wherein the first sensor is provided on the upper surface of the base to signal when the display member is in a position overlying the base; and a second sensor to determine when the display is in the closed position with the screen facing the base or in the open position with the screen facing away from the base.

6. The portable computer of claim 1 in which said first and second hinges are configured to retain said display member in a plurality of continuously successive positions relative to said frame body.

7. The portable computer of claim 1, wherein said display member and said frame body are movable to provide a presentation mode configuration in which said display screen is configured at an angle relative to said base upper surface such that a portion of said peripheral base edge and a portion of said front peripheral display edge are disposed to provide two edges serving as legs to support said portable computer on an external horizontal surface with said display screen exposed for viewing and said keyboard disposed between said base and said display back surface.

8. The portable computer of claim 7, wherein said portable computer further comprises an infrared (IrDA) port for receiving external inputs to control operation of said portable computer while operating in said presentation mode configuration.

9. The portable computer of claim 1 further comprising a keyboard disposed on said base upper surface; and wherein said display member and said frame body are each movable to provide: (i) a first configuration said display screen is configured substantially parallel to said base upper surface for inputting data to said portable computer and covers said keyboard; (ii) a second configuration in which said keyboard accessible for inputting data to said portable computer and said display screen is configured for viewing by a user while accessing said keyboard; and (iii) a third position in which said display screen is configured at an acute angle relative to said base upper surface for presentation to others, a first portion of said front peripheral base edge and a portion of said peripheral display edge are disposed to provide two edges serving as legs to support said portable computer on an external horizontal surface with an outwardly directed display screen for presentation, a first portion of said peripheral base edge and a portion of said peripheral display edge are disposed to provide two edges serving as legs to support said portable computer on an external horizontal surface with an outwardly directed display screen for presentation.

10. The portable computer of claim 1, further comprising a keyboard disposed on said base upper surface; and wherein said display screen is outwardly disposed to present displayed information in normal up-down and right-left orientation, a first portion of said front peripheral base edge and a portion of said peripheral display edges are disposed to provide two edges serving as legs to support said portable computer on a surface below said portable computer with said base forming an acute angle with said display member, said keyboard disposed between said base and said display member back surface.

11. The portable computer in claim 1, wherein the height and angle of the display relative to said base may be adjusted independent of each other to provide a user selectable viewing position and angle.

12. The portable computer in claim 1, further comprising a keyboard disposed on said base upper surface, and wherein said keyboard is curved about an axis substantially intersecting the center-line of said keyboard so that said keyboard ergonomically positions hands of a user with the elbows extending outwardly from the user's body when accessing said keyboard.

13. The portable computer in claim 1, wherein:
the frame body couples said display member to said base such that the display member may be moved to a plurality of different positions, including a plurality of open positions in which the display is tilted at a viewing angle;
both the height and angle of said display member and said screen relative to the base may be adjusted; and
said height and angle adjustment including a position where the display is suspended above an upper surface of said base allowing said display to be oriented at an angle greater than 90° and extend toward a user and not extend beyond the footprint of said base without increasing overall footprint size.

14. The portable computer in claim 1, wherein:
the frame body couples the display member to the base such that the display member may be moved to a plurality of different positions, including a plurality of open positions in which the display is tilted at a viewing angle;
both the height and angle of the display member and the screen relative to the base may be adjusted; and
said height and angle adjustment including a position where the lower edge of the display rests on an upper surface of the base so that the display does not increase the footprint size of the portable computer.

15. The portable computer in claim 1, wherein:
the frame body couples the display member to the base such that the display member may be moved to a plurality of different positions;
said portable computer further comprises a touch sensitive screen for inputting data and commands; and
both the height and angle of the display member and the screen relative to the base are adjusted so that the screen is exposed when the display is lowered onto said upper surface of the base so that the computer functions as a notepad computer and data is entered entirely through the touch sensitive screen.

16. The portable computer in claim 15, wherein:
said touch sensitive screen is configured to display a virtual keyboard such that areas of said screen display keys, and when touched transmit the letter, number, or other character to a CPU within said portable computer as if an actual keyboard were provided; and
said touch sensitive screen being operable to input graphical (stylus) inputs as well as keyboard inputs without changing said configuration of said portable computer.

17. The portable computer in claim 16, wherein:
the screen display keys are arranged in a standard QWERTY keyboard layout pattern.

18. The portable computer in claim 1, wherein the arm portions are oriented substantially perpendicular to the base ensuring that the center of gravity of the display is always located directly above the base, increasing the stability of the computer and preventing the computer from falling backward.

19. A portable computer comprising:
a base having an upper surface, a bottom surface, and spaced first and second side edges, a rear end portion, and a front end portion;
a display member having a front surface having a screen for displaying information, a back surface, and first and second peripheral display edges joining said front and back surfaces;
a keyboard disposed on said base upper surface;
an infrared wireless communication device for communicating between a processor internal to said portable computer and an external infrared transmitter;
a U-shaped frame body mounting said display member to said base, said frame body including:
first and second spaced lateral arm portions positioned outwardly of said side edges of said base and said peripheral display edges when said display member is lowered onto said base; and
a rigid connecting portion extending along said rear end portion of said base between said arm portions having a curved tubular cross section that reinforces the U-shaped frame body to provide stability, rigidity, and reduce torsional stresses during movement of the frame body and forms a concave pocket to receive a substantially conforming convex portion of said base at the rear end portion of said base;
said frame body being pivotally coupled to said first display edge for rotation of said display member relative to said first arm portion, and pivotally coupled to said first side edge of said base at said rear end portion of said base for rotation of said frame body relative to said base, said rigid curved tubular connecting portion of said frame body sliding concentric with and relative to said convex portion of said base during rotation of said frame body relative to said base;
said first arm portion being provided first and second friction hinges and said second arm portion being provided with no hinges, said first spaced lateral arm portion being pivotally coupled to said first peripheral edge of said display member by a first friction hinge and to said base by a second friction hinge; and
said second arm portion being provided with an aperture forming an internal conduit from said base to said second arm portion which houses an electrical connector for coupling said screen housed in said display member to electrical components housed in said base;
said electrical connectors being carried by a ribbon;
said ribbon being threaded through a path in said second arm portion which minimizes stresses exerted on said ribbon during rotation of said frame body relative to said base, and rotation of said display member relative to said arm member;
said stress minimizing path including providing a complete first loop formed in said ribbon as said ribbon enters said arm portion from said display member, said first loop selectively becoming tighter and looser as said display is pivoted relative to said arm portion, preventing said electrical connectors from crimping; and
said stress minimizing path further including providing a second loop before said ribbon enters said base, said second loop selectively becoming tighter and looser as said arm portion is pivoted relative to said base, preventing said electrical connectors from crimping; said second loop reducing stresses on said ribbon during manipulation of said frame body;

said first and second friction hinges are configured for rotation of said frame body between a plurality of configurations including:

(i) a first closed configuration in which said display screen is configured substantially parallel to said base upper surface and facing toward said base upper surface in a closed position to cover said keyboard and said arm portions of said frame body are positioned adjacent said side edges of said base;

(ii) a second configuration in which said display screen is configured substantially parallel to said base upper surface for inputting data to said portable computer and covers said keyboard and said arm portions of said frame body are positioned adjacent said side edges of said base;

(iii) a third configuration in which said keyboard accessible for inputting data to said portable computer and said display screen is configured for viewing by a user while accessing said keyboard; and (iv) a fourth position in which said display screen is configured at an acute angle relative to said base upper surface for presentation to others and a first portion of said peripheral base edge and a portion of said peripheral display edges are disposed to support said portable computer on a surface with an outwardly directed display screen for presentation.

20. The portable computer in claim 1, wherein:

each said first and second hinge including respective first and second outer sleeves and first and second cylinders;

said first and second outer sleeves being fixedly mounted proximate upper and lower ends of said first arm portion, with an attachment tab projecting from said first cylinder into said display member for attachment thereto, and from said second cylinder into said base for attachment thereto;

said first cylinder attachment tab being mounted to an interior skeletal frame of said display member;

said first cylinder being rotatable within said first sleeve upon application of sufficient force to said first cylinder through said display member and said first attachment tab to overcome first frictional forces between said exterior of said first cylinder and said interior of said first sleeve;

said second cylinder being rotatable within said second sleeve upon application of sufficient force to said second cylinder through said arm portion and said second attachment tab to overcome first frictional forces between said exterior of said second cylinder and said interior of said second sleeve; and said frictional forces of said first and second hinges between said sleeves and said cylinders being sufficient to retain said display in a desired position once adjusted to that position by a user.

21. The portable computer in claim 20, wherein:

each of the hinges includes a plurality of locking positions, a first one of the locking positions corresponding to a closed position of the display member and a second one of the locking position corresponding to an open position of the display member; and when the display member is in either of these two locking positions, a greater force must be applied to the display member to move the display member from the locking position.

22. The portable computer in claim 21, wherein between the first and second locking positions, the display member is held in place by friction.

23. The portable computer in claim 20, wherein:

said second hinge includes an outer sleeve mounted to said base, and an attachment tab projecting from the cylinder mounted to the arm portion; said sleeve is mounted to the base by a metal band which is mounted at one end to the base; and said band extends around said sleeve and another end of the band engages said rear edge of said base, with the band applying a compressive force to secure said sleeve in a fixed position.

24. The portable computer in claim 23, wherein as said U-shaped frame body and said display member approaches a closed position said friction hinge includes a detent mechanism that tends to rotate said second hinge and structures attached thereto toward the closed position such that said display member is snapped toward said base, facilitating closure of said portable computer so that a separate locking mechanism is not required, yet said portable computer is maintained in a closed position.

25. The portable computer in claim 1, wherein:

said electrical connectors being carried by a ribbon;

said ribbon being threaded through a path in said second arm portion which minimizes stresses exerted on said ribbon during rotation of said frame body relative to said base, and rotation of said display member relative to said arm member;

said stress minimizing path including providing a complete first loop formed in said ribbon as said ribbon enters said arm portion from said display member, said first loop selectively becoming tighter and looser as said display is pivoted relative to said arm portion, preventing said electrical connectors from crimping; and said stress minimizing path further including providing a second loop before said ribbon enters said base, said second loop selectively becoming tighter and looser as said arm portion is pivoted relative to said base, preventing said electrical connectors from crimping; said second loop reducing stresses on said ribbon during manipulation of said frame body.

26. The portable computer in claim 1, further comprising a battery and wherein said battery is positioned in a rounded portion of said base such that a pivot axis of said U-shaped frame body extends through said battery so that the overall size of the computer is reduced.

27. The portable computer in claim 1, wherein said portable computer further comprises a memory access door and a battery access door, and each of said memory access door and said battery access door includes at least one sensor which senses a state indicating whether or not a respective door is open or closed, the state of each of the doors identifying one of predetermined operating modes depending upon said sensed door state.

* * * * *